United States Patent [19]

Kobayashi et al.

[11] Patent Number: 5,660,971

[45] Date of Patent: Aug. 26, 1997

[54] THIN FILM DEVICE AND A METHOD FOR FABRICATING THE SAME

[75] Inventors: Ikunori Kobayashi, Sakai; Shinichiro Ishihara, Takatsuki; Michiko Okafuji, Katano, all of Japan

[73] Assignee: Matsushita Electric Industrial Co., Ltd., Osaka, Japan

[21] Appl. No.: 632,637

[22] Filed: Apr. 15, 1996

Related U.S. Application Data

[63] Continuation of Ser. No. 296,495, Aug. 26, 1994, abandoned.

[30] Foreign Application Priority Data

Aug. 26, 1993 [JP] Japan .................................. 5-211238

[51] Int. Cl.$^6$ ................................. G03F 7/30; G03F 7/11
[52] U.S. Cl. ................... 430/315; 430/276.1; 430/278.1; 430/314; 430/324; 428/209; 428/457; 428/469; 428/471; 428/620
[58] Field of Search ............................ 430/278.1, 276.1

[56] References Cited

U.S. PATENT DOCUMENTS

| | | | |
|---|---|---|---|
| 4,372,809 | 2/1983 | Grewal et al. | 156/656 |
| 4,420,504 | 12/1983 | Cooper et al. | 430/317 |
| 5,150,233 | 9/1992 | Enomoto et al. | 359/54 |
| 5,296,653 | 3/1994 | Kiyota et al. | 174/250 |

FOREIGN PATENT DOCUMENTS

| | | |
|---|---|---|
| 59-198774 | 11/1984 | Japan . |
| 63-289533 | 11/1988 | Japan . |
| 4-326723 | 11/1992 | Japan . |

OTHER PUBLICATIONS

H. Nishino et al., "Anti-Corrosion Process for Al–ITO System with Electrolytic Development Solution," *Sharp Giho*, No. 44, pp. 31–36 (Mar. 1990).

*Primary Examiner*—Christopher G. Young
*Attorney, Agent, or Firm*—Ratner & Prestia

[57] ABSTRACT

A thin film device includes a substrate, a conductive oxide film formed on the substrate, and a metal film formed on the substrate and in contact with at least a part of the conductive oxide film. The metal film includes aluminum and a metallic material. The metallic material has a standard electrode potential higher than the standard electrode potential of the aluminum so that the standard electrode potential of the metal film is higher than the reduction potential of the conductive oxide film.

18 Claims, 6 Drawing Sheets

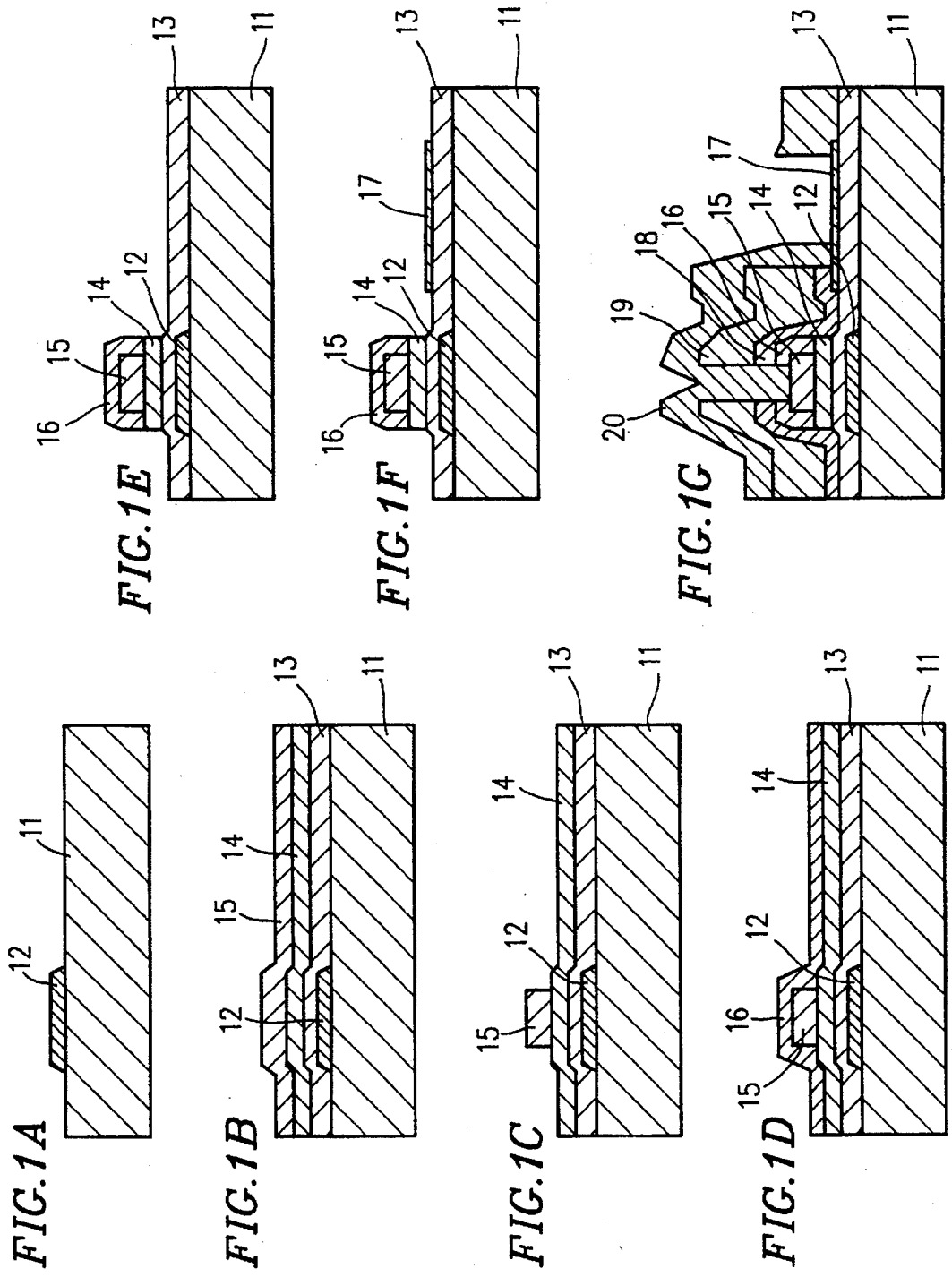

THIN FILM DEVICE AND A METHOD FOR FABRICATING THE SAME

This application is a continuation of application Ser. No. 08/296,495 filed Aug. 26, 1994 now abandoned.

BACKGROUND OF THE INVENTION

1. Field of the Invention

The present invention relates to a thin film device and a method for fabricating the same. More particularly, the invention relates to a thin film device having a transparent electrode made of conductive oxide film, for example, the film devices such as liquid crystal display devices, electro-luminescence display devices and photoelectric transducer devices, and a method for fabricating the same.

2. Description of the Related Art

Thin film devices which employ conductive oxide films as transparent electrodes include liquid crystal display devices, electro-luminescence display devices and photoelectric transducer devices. A technology which uses a transparent electrode made of a conductive oxide will be described below, taking an example of an active matrix type liquid crystal display device.

An active matrix type liquid crystal display device generally has an active matrix substrate, an opposing substrate and a liquid crystal film interposed between the two substrates. The active matrix substrate has a plurality of gate bus lines, a plurality of source bus lines arranged at right angles to the gate bus lines, and a plurality of pixel electrodes arranged within regions enclosed by these bus lines, being formed thereon. Each of the pixel electrodes receives a data signal from the source bus line via a thin film transistor (hereinafter referred to as TFT) which switches on or off in response to a scanning signal transmitted on the corresponding gate bus line. The opposing substrate has a transparent opposing electrode.

With reference to FIG. 6, a TFT of prior art will be described below.

As shown in FIG. 6, the TFT has a gate electrode 2 formed on a substrate 1, a gate insulating film 3 formed over the gate electrode 2, an amorphous silicon (a-Si) film 4 formed on he gate insulating film 3, phosphorous-doped a-Si contact films 5 formed on the a-Si film 4, barrier metal layers 7, and source/drain electrodes 8a and 8b made of aluminum (Al). The gate electrode 2, the gate insulating film 3 and the a-Si film 4 may be arranged in a reversed order. The drain electrode 8b is connected to a pixel electrode 6 made from a transparent conductive film. As the material for the transparent conductive film, indium-tin oxide (ITO) is commonly used.

A process of fabricating the TFT will be described below. First, a Cr film is deposited on the glass substrate 1 and the gate electrode 2 is formed from the Cr film in the photolithography process. Then the gate insulating film 3 made of silicon nitride ($SiN_x$), the a-Si film 4, and the $n^+$-type a-Si film 5 doped with phosphorous to form ohmic contact between the source/drain electrodes 8a and 8b and the semiconductor film are successively deposited in the plasma CVD process, followed by the removal of the a-Si film 4 and the $n^+$-type a-Si film 5, from portions other than those where the TFTs are to be formed, by etching during the photolithography process. Indium-tin oxide (ITO) is deposited so as to form the transparent pixel electrode 6 in the photolithography process. Then a titanium (Ti) film and an aluminum (Al) film are deposited in this order, and then the barrier metal layers 7 and the source/drain electrodes 8a and 8b are formed during the photolithography process, followed by the removal of the $n^+$-type a-Si film 5 from above the TFT channel, thereby completing the TFT.

In the method of fabricating the TFT described above, there has been such a problem that the use of a positive photoresist in the photolithography process to form the source and drain electrodes 8a and 8b leads to the corrosion of the ITO and aluminum during the development process.

The corrosion occurs because ITO and aluminum are immersed in the developer solution while being electrically connected to each other. Specifically, because the developer solution used for the positive photoresist is an alkaline aqueous solution which dissolves aluminum, cell reaction takes place between ITO and aluminum in the developer solution, resulting in the corrosion of ITO and aluminum.

When a negative photoresist is used in the photolithography process, the corrosion does not occur. Thus solutions to the problem of avoiding corrosion have been proposed, such as the use of a negative photoresist and the use of a special solution for the developer. However, since positive photoresist is preferred to form finer patterns because the positive photoresist allows higher patterning accuracy and is easier to peel off, it complicates the fabricating process and increases the cost to use a negative photoresist for the purpose of only patterning aluminum or to use a developer solution comprising a special solution.

Corrosion may not occur in the case of wiring strips formed by using a metal other than aluminum, for example, molybdenum (Mo) or tantalum (Ta). However, these metals have higher specific resistances (i.e., higher resistivities) than aluminum, and therefore the wiring strips made of such metals must be made wider. Such wider wiring strips are not suited to the high-density integration of a thin film device.

SUMMARY OF THE INVENTION

The thin film device of this invention, comprises: a substrate; a conductive oxide film formed on the substrate; and a metal film formed on the substrate and in contact with at least a part of the conductive oxide film, wherein the metal film includes aluminum and a metallic material having a standard electrode potential higher than the standard electrode potential of the aluminum so that the standard electrode potential of the metal film is higher than the reduction potential of the conductive oxide film.

In one embodiment, the aluminum and the metallic material are homogeneously mixed in the metal film.

In one embodiment, at least part of the metallic material forms a corrosion stop layer on the surface of the metal film.

In one embodiment, the metallic material is tungsten.

In one embodiment, concentration of the metallic material included in the metal film is in a range from 0.5 at % to 6 at %.

In one embodiment, the conductive oxide film is made of a material selected from a group of indium oxide, tin oxide and indium-tin oxide.

In one embodiment, a diffusion barrier metal film is further provided between the metal film and the substrate.

The method for fabricating a thin film device of this invention, comprises the steps of: depositing a conductive oxide film on a substrate; patterning the conductive oxide film by a photolithography process; depositing a metal film which includes aluminum and a metallic material, the metallic material having a standard electrode potential higher than the standard electrode potential of the aluminum and has a standard electrode potential higher than the reduction potential of the conductive oxide film; and patterning the metal film by means of photolithography process using a positive photoresist.

In one embodiment, the photolithography process using the positive photoresist includes a development process using a developer solution which dissolves the aluminum.

In one embodiment, the conductive oxide film is made of a material selected from a group of indium oxide, tin oxide and indium-tin oxide.

In one embodiment, the metallic material is tungsten.

In one embodiment, a diffusion barrier metal film is deposited prior to the step of depositing the metal film.

Thus, the invention described herein makes possible the advantages of (1) providing a thin film device which is free from corrosion of a conductive oxide film and a metal wiring, and (2) providing a method for fabricating a thin film device in which a positive photoresist is employed to make a fine metal wiring pattern without corrosion forming on the conductive oxide film and metal wiring.

These and other advantages of the present invention will become apparent to those skilled in the art upon reading and understanding the following detailed description with reference to the accompanying figures.

BRIEF DESCRIPTION OF THE DRAWINGS

FIGS. 1A through 1G are sectional views of the TFT in different stages of a process for fabricating the thin film device of the invention.

DESCRIPTION OF THE PREFERRED EMBODIMENTS

Figure 2A:
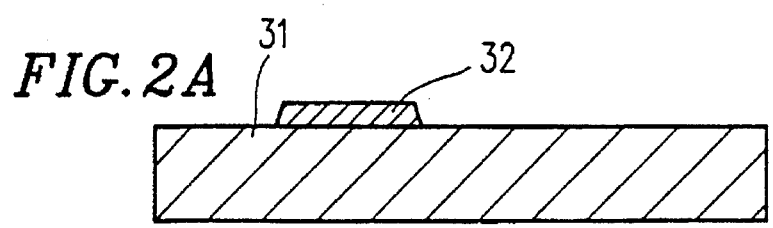
FIGS. 2A through 2E are cross sectional views of the TFT in different stages of a process for fabricating another thin film device of the invention.

Preferred embodiments of the thin film device and the method for fabricating the same according to the invention will be described below with reference to the accompanying drawings.

Example 1

The first example of the thin film device of the invention will be described below. The thin film device is an active matrix type liquid crystal display device having TFTs as switching elements. FIGS. 1A through 1G schematically illustrate a cross-section of the TFT in various stages of the fabricating process for the thin film device.

Referring to FIG. 1A, after depositing a metal film, for example, Cr film, on a transparent insulator substrate 11, the metal film is patterned in a specified configuration during the photolithography process using a positive photoresist, thereby forming a gate electrode 12. A gate bus line (not shown) is formed together with the gate electrode 12 from the metal film.

In the photolithography process using the positive photoresist, an alkaline developer solution is used in the development process. As the developer solution, one made by Tokyo Ohka Co., Ltd. under the product name of NMD-3, for example, may be used. In the photolithography process using a positive photoresist described below, a similar developer solution is used. The term photolithography referred to in this specification includes the processes of exposure of the photoresist to radiation, development and etching of the undercoat.

Then a gate insulating film 13, an amorphous silicon semiconductor film 14 and a channel protection insulator film 15 are laminated in this order on the transparent insulator substrate 11 as shown in FIG. 1B, by means of a thin film deposition technology such as the plasma-enhanced chemical vapor deposition (P-CDV). This is followed by a photolithography process using a positive photoresist to form the channel protection insulator film 15 into a specified pattern as shown in. FIG. 1C, and thereafter the formation of a phosphorous-doped $n^+$-type amorphous silicon film 16 over the transparent insulator substrate 11 as shown in FIG. 1D.

Next the $n^+$-type amorphous silicon film 16 and the amorphous silicon semiconductor film 14 are patterned in a photolithography process using a positive photoresist as shown in FIG. 1E, so that the film 16 completely covers the channel protection insulator film 15 in areas where the TFTs are to be formed.

Then after depositing an ITO film, which is a conductive oxide film, over the transparent insulator substrate 11, the ITO film is patterned in a positive photolithography process to form a transparent pixel electrode 17, as shown in FIG. 1F.

Next, a diffusion barrier metal layer (for example, 50 nm to 100 nm thick) 18 such as Ti and an Al alloy layer (for example, 300 nm to 500 nm thick) with 3 at % of tungsten (W) added thereto are successively deposited over the transparent insulator substrate 11. The Al alloy layer with 3 at % of tungsten (W) added thereto may be formed by various thin film depositing technologies such as DC sputtering using an Al alloy target. Although the method and conditions of the deposition are not limited, it is necessary that the W and Al are not separated in the resultant Al alloy layer.

The Al alloy layer is electrically connected to the transparent pixel electrode 17 via the diffusion barrier metal layer 18. The diffusion barrier metal layer 18 prevents interdiffusiton between the Al alloy layer and the $n^+$-type amorphous silicon film 16 from diffusing into each other.

Then the Al alloy layer and the diffusion barrier metal layer 18 are patterned in a photolithography process using a positive photoresist, thereby forming the source/drain electrodes 19. The shape and position of the drain electrode 19 is so defined so as to connect the transparent pixel electrode 17 and the $n^+$-type amorphous silicon film 16. In this embodiment, the Al alloy layer 19 and the transparent pixel electrode 17 are not corroded during the development process of the photolithography using the positive photoresist, for the reason to be described later. Then after depositing a passivation film 20 such as $SiN_x$, part of the passivation film 20 is removed in order to expose the transparent pixel electrode 17.

The active matrix substrate is fabricated in the process described above. After laminating this substrate and the substrate having the opposing electrode by a known method, liquid crystal is sealed between the substrates so as to complete the liquid crystal display device.

In this embodiment, the Al alloy layer is patterned in a photolithography process using a positive photoresist, after depositing the Al alloy layer with W added thereto so as to cover the ITO. Because the Al alloy layer with W added thereto does not have an oxidation-reduction reaction with the ITO, even in a developer solution for positive photoresist, the corrosion of the ITO can be prevented. Now the mechanism wherein the use of the Al alloy layer with W added thereto prevents corrosion will be described below.

Figure 4:
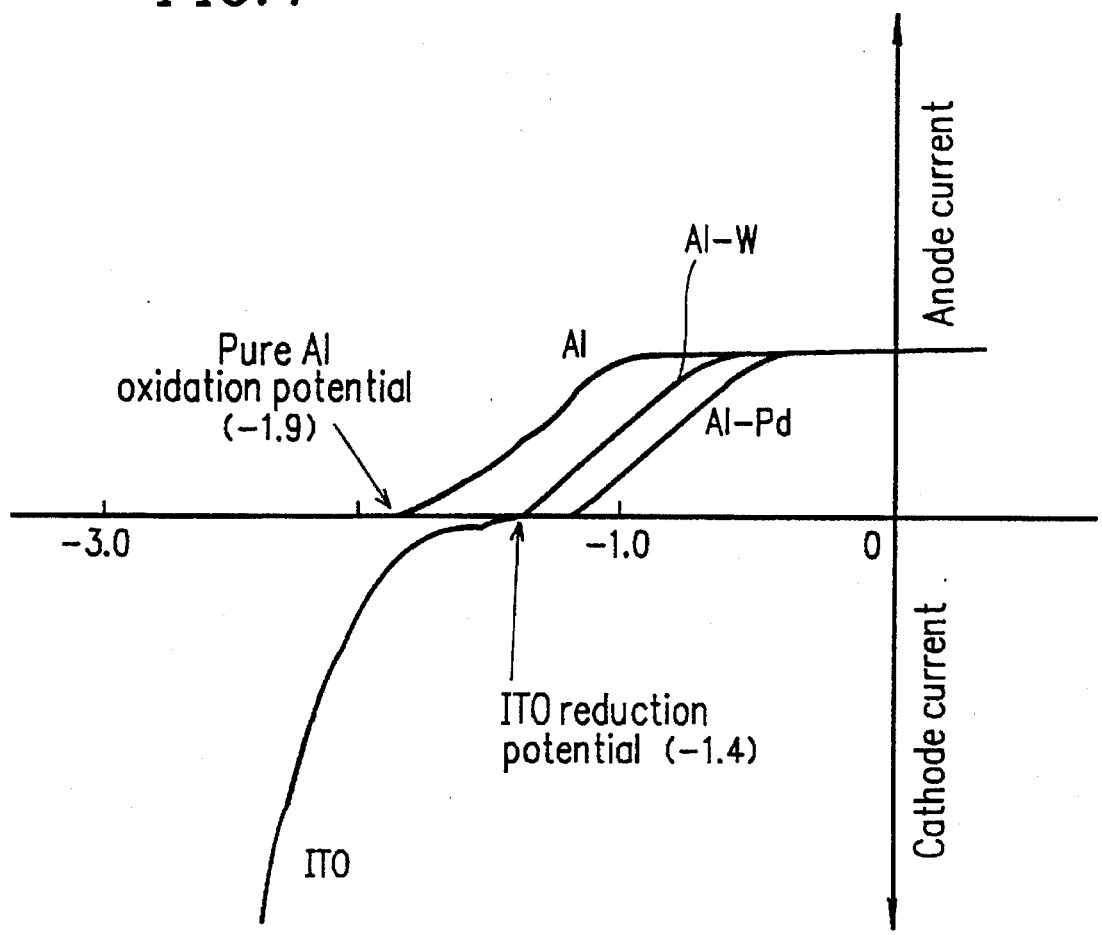
FIG. 4 is a graph illustrative of an ITO cathode polarization curve of ITO and anode polarization curves of various metals in the developer solution for positive photoresist.

FIG. 4 shows a cathode polarization curve of ITO and anode polarization curves of various metals in a developer solution for positive photoresist. As will be seen from FIG. 4, the equilibrium potential (oxidation potential) of the anode reaction of pure Al is lower than the equilibrium potential (reduction potential) of the cathode reaction of the ITO. As a result, when pure Al and ITO are brought into contact with each other and immersed in a developer solution for positive photoresist, the pure Al and the ITO exchange electrons therebetween while galvanic corrosion (cell reaction) proceeds in the interfaces between the pure Al, the developer solution and the ITO. It is supposed that the developer solution and the ITO make contact with each other through pin holes or the like formed in the pure Al. This corrosion can take place, besides ITO film, in a conductive oxide film such as indium oxide film or tin oxide film.

In contrast, the equilibrium potential (oxidation potential) of the anode reaction in an Al alloy layer with a specified amount of W or paradium (Pd) added thereto is higher than the equilibrium potential (reduction potential) of the cathode reaction of the ITO. Because the standard electrode potentials of W and Pd are higher than the standard electrode potential of Al, the addition of W or Pd increases the standard electrode potential of the Al alloy. The amount of W or Pd to be added is determined so that the standard electrode potential of the Al alloy is higher than the standard electrode potential of the ITO. As a result, when the Al alloy and the ITO are brought into contact with each other and immersed in a developer solution for a positive photoresist, the Al alloy and the ITO do not exchange electrons therebetween and galvanic corrosion reaction does not proceed in the interfaces between the pure Al, the developer solution and the ITO. Therefore, even when pin holes or the like are formed in Al, Al and ITO will not be corroded.

Although not shown in FIG. 4, it was confirmed that similar effects are obtained by using vanadium, platinum, indium or nickel, as well as W and Pd, as the additive metal to Al.

Figure 5:
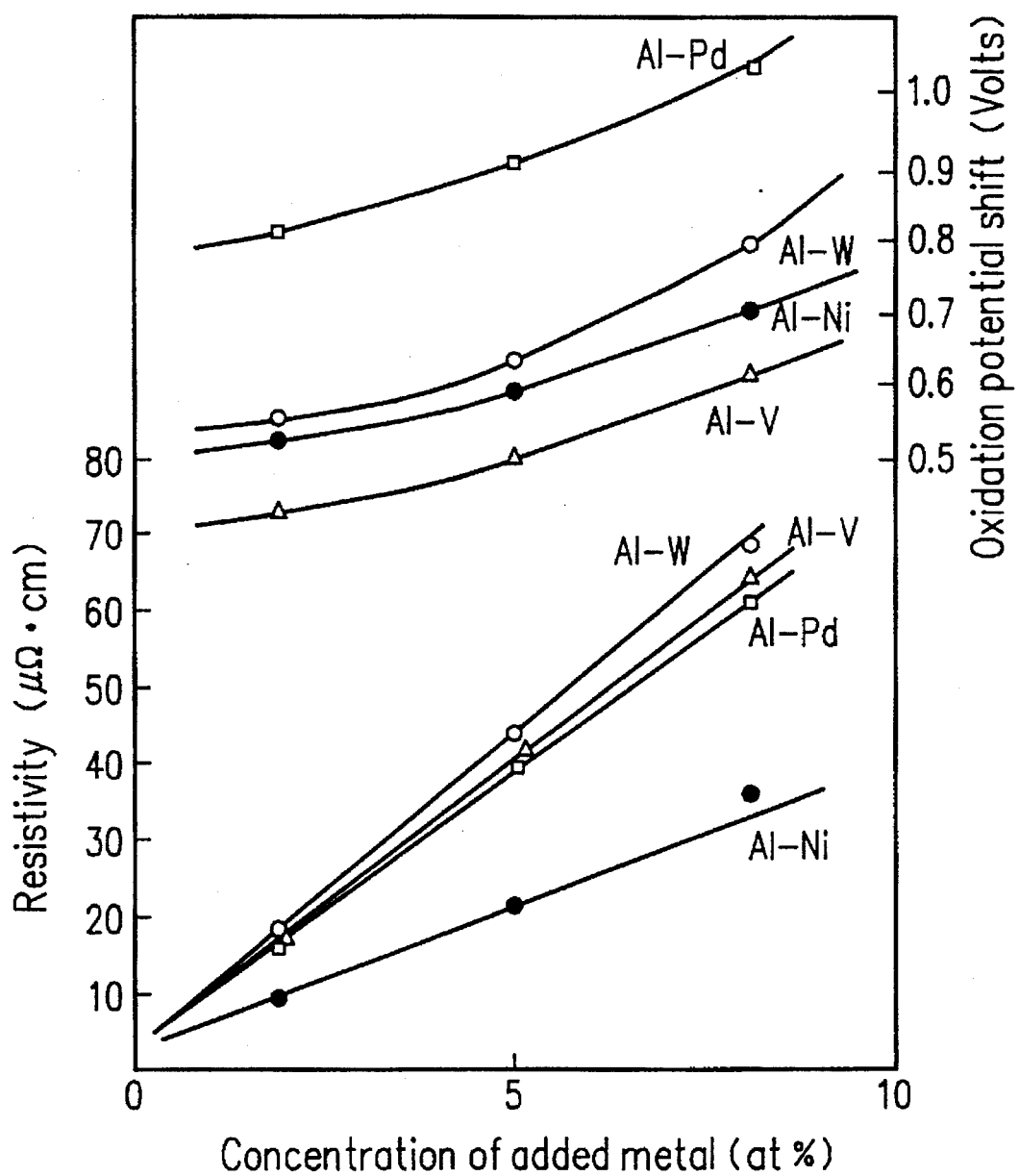
FIG. 5 is a diagram illustrative of the changes in the specific resistance of Al with various metals added thereto and in the amount of shift of the equilibrium potential with the concentrations of the added metals.
Figure 6:
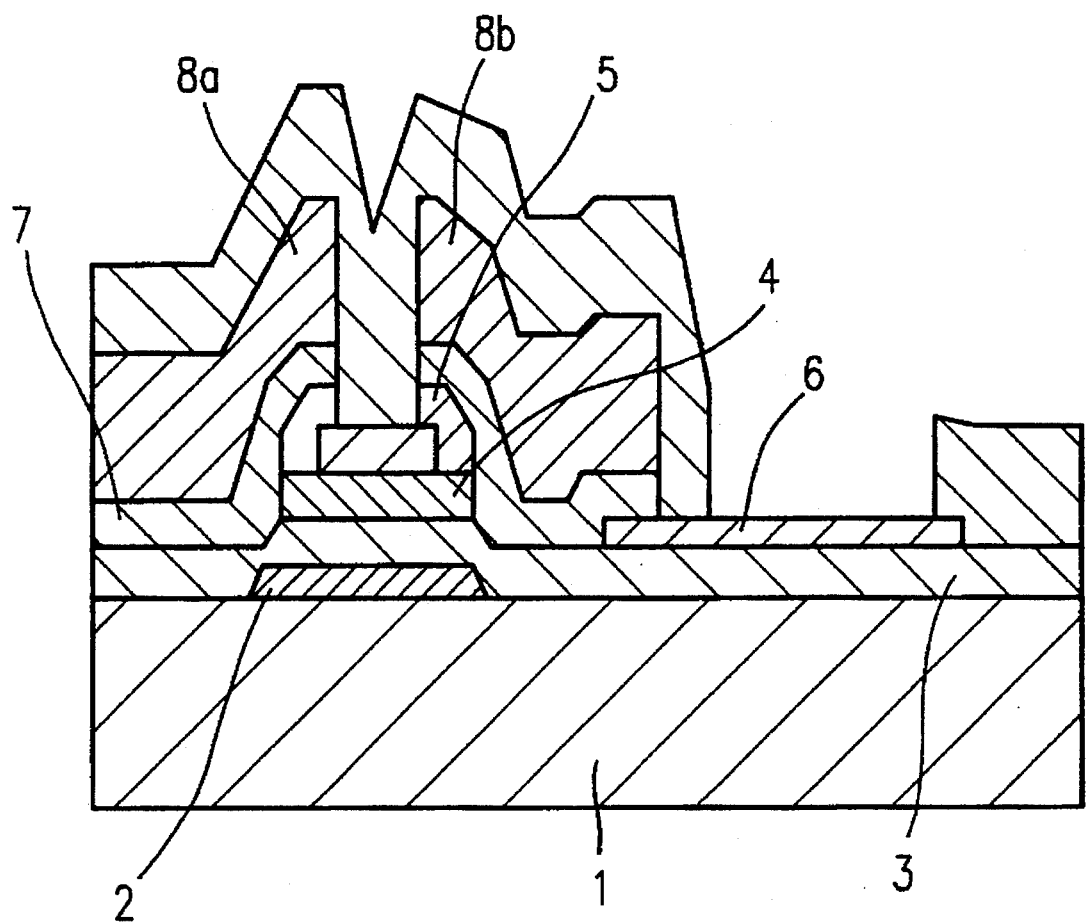
FIG. 6 is a cross sectional view illustrative of a thin film device of the prior art.

FIG. 5 shows the changes in the specific resistance (resistivity) of Al with various metals added thereto and in the amount of shift of the equilibrium potential of oxidation reaction with different concentrations of added metals. As will be seen from FIG. 5, the specific resistance increases and, moreover, the amount of shift in the oxidation potential increases as the concentration of added metal increases. The concentration of metal to be added is determined so that the standard electrode potential of the Al alloy becomes higher than the standard electrode potential of ITO. Because the amount of shift in the equilibrium potential of the oxidation reaction varies depending on the kind of metal added, the concentration of the added metal is adjusted according to the kind of metal. In the case of W and Pd, adding in a very low concentration (about 0.5 at %) is sufficient to obtain the proper amount of shift of the equilibrium potential of the oxidation reaction.

Because adding such a metal as described above increases the specific resistance of the Al alloy, the upper limit of the concentration of the added metal is determined by taking the specific resistance of the Al alloy into consideration. Chromium is known as a metal which has a relatively low specific resistance and is not corroded by a developer solution. Specific resistance of chromium is 50 μΩ·cm, and therefore concentration of the metal added in the Al alloy should be set so that the specific resistance of the Al alloy does not exceed 50 μΩ·cm. In the case of W, concentration thereof to be added is preferably 6 at % or less in order to maintain the specific resistance below that of chromium.

The prevention of corrosion does not require the added metal such as W to be uniformly distributed over the entire Al alloy layer. The surf of the Al alloy layer functions as a corrosion stop layer and thereby demonstrates sufficient anti-corrosion effect, provided that the added metal (such as W) be uniformly distributed at least in the surface of the Al alloy layer.

Example 2

The second example of the thin film device according to the invention will be described below with reference to FIGS. 2A through 2E.

Referring to FIG. 2A, after depositing a metal film (for example, Cr film) on a transparent insulator substrate 31, the metal film is patterned in a specified configuration during the photolithography process using a positive photoresist, thereby forming a light blocking metal film 32.

Figure 2B:
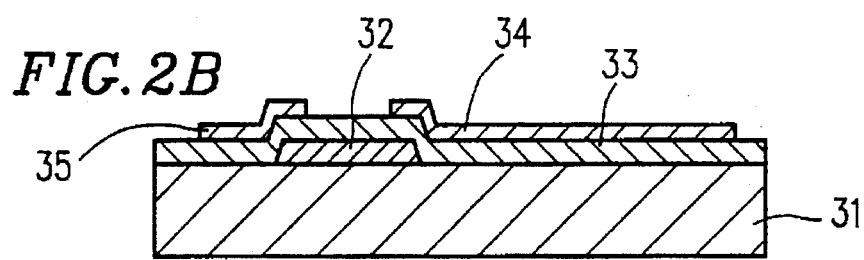

Then after forming an interlayer insulation film 33 and an ITO film, which is an oxide conductor, in this order over the transparent insulator substrate 31 by means of the P-CVD method or the like, the ITO film is patterned in a photolithography process using a positive photoresist, thereby forming a source electrode 35 and a pixel electrode 34, as shown in FIG. 2B.

Figure 2C:
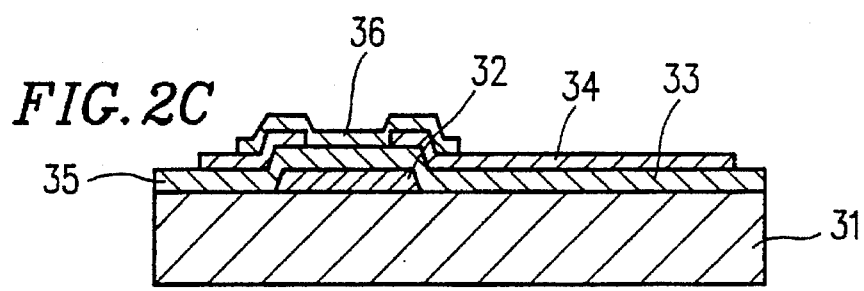
Figure 2D:
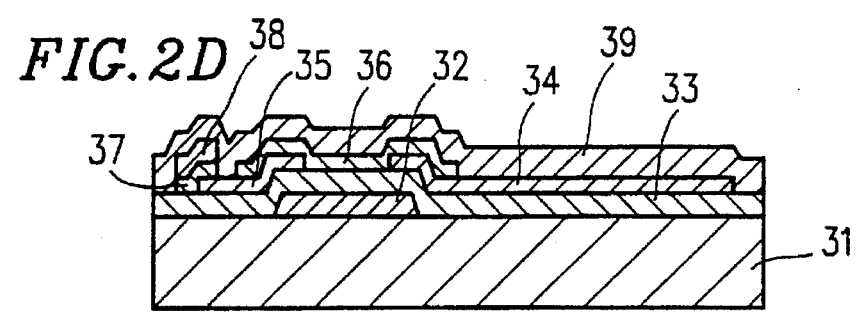

Then after forming an amorphous silicon semiconductor film by means of the P-CVD method or the like, the amorphous silicon semiconductor layer is patterned thereby forming an island-shaped amorphous silicon semiconductor layer 36 as shown in FIG. 2C. This is followed by the successive deposition of a diffusion barrier metal layer 37 made of Mo and an Al alloy layer 38 with 3 at % of tungsten (W) added thereto over the transparent insulator substrate 31 as shown in FIG. 2D. The Al alloy layer 38 is electrically connected to the source electrode 35 via the diffusion barrier metal layer 37. Then the Al alloy layer 38 and the diffusion barrier metal layer 37 are patterned in a photolithography process using a positive photoresist, thereby forming a source bus line.

Figure 2E:
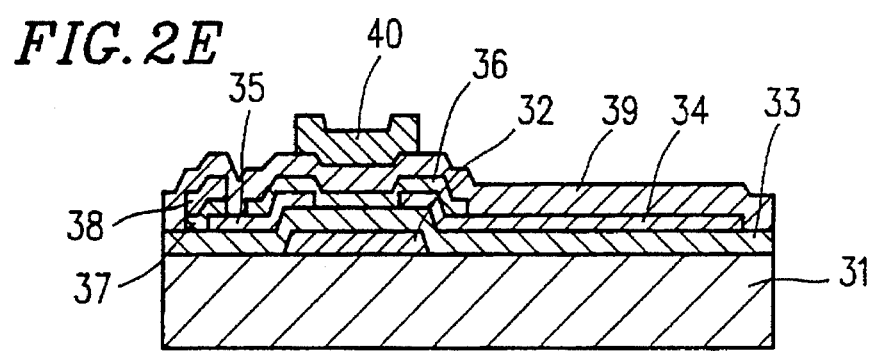

Next, after depositing the gate insulating film 39, an Al gate 40 is formed as shown in FIG. 2E, by means of the P-CVD method or the like.

In this embodiment, the member electrically connected to the Al alloy layer 38 is the source electrode 35 which is made from ITO. Corrosion is also prevented in this case as in the case of the first embodiment.

Example 3

The third example of the thin film device according to the invention will be described below with reference to FIG. 3.

Figure 3:
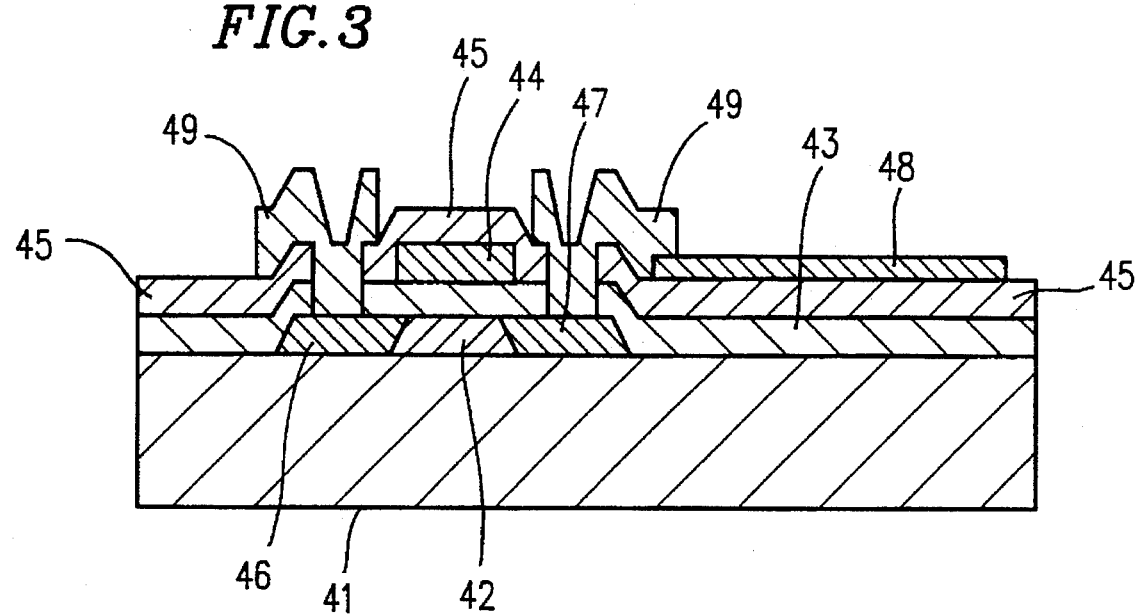
FIG. 3 is a cross sectional view of another thin film device of the invention.

The thin film device shown in FIG. 3 is fabricated as described below. First, a polycrystalline silicon semiconductor 42 is deposited on the transparent insulator substrate 41, and the polycrystalline silicon semiconductor 42 is patterned into an island shape. Then after depositing a gate insulating film 43 made of SiO₂ on the transparent substrate 41 by the LPCVD method, a gate electrode 44 is formed above the polycrystalline silicon semiconductor 42. After depositing the interlayer insulator film 45 made of $SiO_2$, openings are made in the gate insulating film 43 in order to form a source region 46 and a drain region 47 in the polycrystalline silicon semiconductor 42. Phosphorous ions are implanted into the polycrystalline silicon semiconductor 42 through the openings, to form the source region 46 and the drain region 47. Then after forming a transparent pixel electrode 48 made of ITO, an Al alloy layer with W added thereto is deposited so as to cover the transparent pixel electrode 48. This is followed by patterning the Al alloy layer with W added thereto in a photolithography process using a positive photoresist, so as to form source/drain electrodes 49. The position and shape of the drain electrode 49 is so determined as to connect the drain region 47 of the polycrystalline silicon semiconductor 42 and the transparent pixel electrode 48.

In this embodiment, the member electrically connected to the Al alloy layer is the pixel electrode which is made from ITO. Corrosion is also prevented in this case as in the case of the first embodiment.

Although the invention has been described taking liquid crystal display devices as examples, the invention is not limited to this and may be applied to any thin film device which is fabricated by immersing a conductive oxide film and a metal film, which are electrically connected to each other, in a developer solution for positive resist. The developer solution for positive photoresist may be any solution, provided that it dissolves Al.

Although the metal film electrically connected to the conductive oxide film is a source electrode (source bus line) or a drain electrode in the above examples, gate electrodes may also be electrically connected to the conductive oxide film. In a liquid crystal display device, for example, there are such cases as a wiring pattern made of ITO which are arranged around a display section so as to be connected to the gate electrode wiring. In such cases, corrosion by a developer solution for positive resist can be prevented by applying the constitution of the invention to the gate electrode.

For the conductive oxide film, metal oxides having electrical conductivity such as indium oxide film or tin oxide film may be used, as well as ITO film.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film device comprising:
    a substrate;
    a conductive oxide film formed on the substrate; and
    a metal film formed on the substrate and having a standard electrode potential higher than a reduction potential of the conductive oxide film, said metal film being in contact with at least a part of the conductive oxide film, wherein
    the metal film is made of aluminum and a metallic material, the metallic material having a standard electrode potential higher than a standard electrode potential of the aluminum to thereby provide the metal film with the standard electrode potential that is higher than the reduction potential of the conductive oxide film.

2. A thin film device according to claim 1, wherein the aluminum and the metallic material are homogeneously mixed in the metal film.

3. A thin film device according to claim 1, wherein at least part of the metallic material forms a corrosion stop layer on the surface of the metal film.

4. A thin film device according to claim 1, wherein the metallic material is tungsten.

5. A thin film device according to claim 2, wherein the concentration of the metallic material included in the metal film is in a range from 0.5 atom % to 6 atom %.

6. A thin film device according to claim 1, wherein the conductive oxide film is made of a material selected from a group of indium oxide, tin oxide and indium-tin oxide.

7. A thin film device according to claim 1, wherein a diffusion barrier metal film is further provided between the metal film and the substrate.

8. A method for fabricating a thin film device, comprising the steps of:
    depositing a conductive oxide film on a substrate;
    patterning the conductive oxide film by a photolithography process;
    depositing a metal film which is made of an aluminum alloy comprising a mixture of aluminum and a metallic material, the metallic material having a standard electrode potential higher than a standard electrode potential of the aluminum, and a standard electrode potential of the metal film is higher than a reduction potential of the conductive film; and
    patterning the metal film by means of a photolithography process using a positive photoresist.

9. A method according to claim 8, wherein the photolithography process using the positive photoresist includes a development process using a developer solution which dissolves the aluminum.

10. A method according to claim 8, wherein the conductive oxide film is made of a material selected from a group of indium oxide, tin oxide and indium-tin oxide.

11. A method film device according to claim 8, wherein the metallic material is tungsten.

12. A method according to claim 8, wherein a diffusion barrier metal film is deposited prior to the step of depositing the metal film.

13. A thin film device comprising:
    a substrate;
    a conductive oxide film formed on the substrate; and
    a metal film formed on the substrate and having a standard electrode potential higher than a reduction potential of the conductive oxide film, said metal film being in contact with at least a part of the conductive oxide film, wherein
    the metal film is made of aluminum and a metallic material selected from a group consisting of tungsten, palladium, vanadium, platinum, indium or nickel to thereby provide the metal film with the standard electrode potential that is higher than the reduction potential of the conductive oxide film.

14. A thin film device according to claim 13, wherein the aluminum and the metallic material are homogeneously mixed in the metal film.

15. A thin film device according to claim 13, wherein at least part of the metallic material forms a corrosion stop layer on the surface of the metal film.

16. A thin film device according to claim 14, wherein the concentration of the metallic material included in the metal film is in a range from 0.5 atom % to 6 atom %.

17. A thin film device according to claim 13, wherein conducive oxide film is made of a material selected from a group of indium oxide and indium-tin oxide.

18. A thin film device according to claim 13, where a diffusion barrier metal film is further provided between the metal film and the substrate.

* * * * *

UNITED STATES PATENT AND TRADE MARK OFFICE
CERTIFICATE OF CORRECTION

PATENT NO.    : 5,660,971
DATED         : August 26, 1997
INVENTOR(S)   : Kobayashi et al.

It is certified that errors appear in the above-identified patent and that said Letters Patent is hereby corrected as shown below:

Column 8, line 61, delete "conducive" and insert --conductive--.

Column 8, line 63, delete "where" and insert --wherein--.

Signed and Sealed this

Twenty-second Day of September, 1998

Attest:

BRUCE LEHMAN

*Attesting Officer*  Commissioner of Patents and Trademarks